US010190868B2

(12) United States Patent
Lee et al.

(10) Patent No.: US 10,190,868 B2
(45) Date of Patent: Jan. 29, 2019

(54) METROLOGY SYSTEM, METHOD, AND COMPUTER PROGRAM PRODUCT EMPLOYING AUTOMATIC TRANSITIONING BETWEEN UTILIZING A LIBRARY AND UTILIZING REGRESSION FOR MEASUREMENT PROCESSING

(71) Applicant: KLA-Tencor Corporation, Milpitas, CA (US)

(72) Inventors: Liequan Lee, Fremont, CA (US); Raphael Jean Michel Marie Getin, San Jose, CA (US); Meng Cao, Union City, CA (US); Leonid Poslavsky, Belmont, CA (US); Torsten Rudolf Kaack, Los Altos, CA (US); Hong Qiu, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 293 days.

(21) Appl. No.: 14/826,079

(22) Filed: Aug. 13, 2015

(65) Prior Publication Data

US 2016/0320315 A1     Nov. 3, 2016

Related U.S. Application Data

(60) Provisional application No. 62/155,339, filed on Apr. 30, 2015.

(51) Int. Cl.
*G01B 11/02* (2006.01)
*G06N 5/02* (2006.01)
*G03F 7/20* (2006.01)

(52) U.S. Cl.
CPC .......... *G01B 11/02* (2013.01); *G03F 7/70625* (2013.01); *G06N 5/02* (2013.01)

(58) Field of Classification Search
CPC .... G01B 11/02; G01R 31/2656; G01Q 10/06; G01Q 10/065; G03F 7/70625; G06N 5/02
See application file for complete search history.

(56) References Cited

U.S. PATENT DOCUMENTS

| | | | |
|---|---|---|---|
| 5,608,526 A | 3/1997 | Piwonka-Corle et al. |
| 5,859,424 A | 1/1999 | Norton et al. |
| 6,188,078 B1 | 2/2001 | Bell, Jr. et al. |
| 6,429,943 B1 | 8/2002 | Opsal et al. |
| 6,721,045 B1 | 4/2004 | Hunter |
| 6,768,983 B1 | 7/2004 | Jakatdar et al. |
| 6,785,638 B2 | 8/2004 | Niu et al. |
| 7,031,848 B2 | 4/2006 | Opsal et al. |

(Continued)

OTHER PUBLICATIONS

International Search Report from International Application No. PCT/US2016/030269, dated Aug. 24, 2016.
U.S. Appl. No. 14/294,540, filed Jun. 3, 2014.

*Primary Examiner* — Stephen W Smoot
(74) *Attorney, Agent, or Firm* — Zilka-Kotab, PC (57) ABSTRACT

A metrology system, method, and computer program product that employ automatic transitioning between utilizing a library and utilizing regression for measurement processing are provided. In use, it is determined, by the metrology system, that a predetermined condition has been met. In response to determining that the predetermined condition has been met, the metrology system automatically transitions between utilizing a library and utilizing regression for measurement processing.

11 Claims, 6 Drawing Sheets

(56) References Cited

U.S. PATENT DOCUMENTS

| | | |
|---|---|---|
| 7,092,110 B2 | 8/2006 | Balasubramanian et al. |
| 7,478,019 B2 | 1/2009 | Zangooie et al. |
| 7,933,026 B2 | 4/2011 | Opsal et al. |
| 8,577,820 B2 | 11/2013 | Jin et al. |
| 8,762,100 B1 | 6/2014 | Chu et al. |
| 8,798,966 B1 | 8/2014 | Hench et al. |
| 8,812,277 B2 | 8/2014 | Li |
| 8,904,560 B2 | 12/2014 | Shi et al. |
| 2009/0240537 A1* | 9/2009 | Tian .................. G01B 11/24 705/7.36 |
| 2009/0248339 A1 | 10/2009 | Tian et al. |
| 2011/0246141 A1 | 10/2011 | Li |
| 2012/0210289 A1* | 8/2012 | Hench .............. G03F 7/70491 716/122 |
| 2012/0323356 A1 | 12/2012 | Dziura et al. |
| 2013/0110477 A1 | 5/2013 | Pandev |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2015/0204664 A1 | 7/2015 | Bringoltz et al. |

\* cited by examiner

Fig. 6

METROLOGY SYSTEM, METHOD, AND COMPUTER PROGRAM PRODUCT EMPLOYING AUTOMATIC TRANSITIONING BETWEEN UTILIZING A LIBRARY AND UTILIZING REGRESSION FOR MEASUREMENT PROCESSING

RELATED APPLICATION(S)

This application claims the benefit of U.S. Provisional Patent Application No. 62/155,339 filed Apr. 30, 2015, the entire contents of which are incorporated herein by reference.

FIELD OF THE INVENTION

The present invention relates to metrology systems, and more particularly to measurement processes used in metrology systems.

BACKGROUND

Metrology generally involves measuring various physical features of a target component. For example, structural and material characteristics (e.g. material composition, dimensional characteristics of structures and/or critical dimensions of structures, etc.) of the target component can be measured using metrology systems. In the example of semiconductor metrology, various physical features of a fabricated semiconductor component may be measured using a metrology system.

Currently, metrology systems employ either libraries or regression for performing the measurement. However, each of these measurement processes inherently exhibit their own respective limitations, such that there is a need for addressing these and/or other issues associated with the prior art.

For example, when making a measurement, non-linear least square is often used to fit a set of observed signals collected from one or a combined set of metrology tools with calculated signals from a non-linear model containing a set of floating parameters, including those characteristics to be measured. If Maxwell's equations are solved vigorously in real-time to obtain the calculated signals for a corresponding floating parameter set, it is referred to measurement with real-time regression (or RTR). On the other hand, a parametric non-linear model may be created offline to approximate the solutions of Maxwell's equations. During the measurement, the parametric model can be used for fast and accurate approximation to the calculated signals. The parametric model is called a library, and its corresponding measurement is denoted as a library measurement.

RTR measurement generally uses a large computing farm to evaluate theoretical signals for given set of parameters by vigorously solving Maxwell's equations in real-time. RTR measurement can quickly adapt to process changes without a need of lengthy library changes. Therefore, the time to make process changes and to keep measurement is short. Unfortunately, however, it requires a more expensive computing platform to support real-time computations. Furthermore, overall throughput of the metrology system is slowed down by the calculations linked to solving Maxwell's equations in real-time. This results in a high cost of metrology using RTR, both from the perspective of computations and a number of metrology tools required.

Library measurement is generally very fast and only needs a workstation or a server to provide adequate computing power. However, in the event of large process changes that are beyond the pre-defined range of parameters in the library, it will take a significant amount of time to change and re-qualify a new library in order to recover the measurement credibility. Until the measurement creditability is recovered, the measurement process is at risk of an excursion that cannot be detected since no metrology is available (i.e. the measurement is generally skipped), possibly impacting the yield on a significant number of components under measurement.

SUMMARY

A metrology system, method, and computer program product that employ automatic transitioning between utilizing a library and utilizing regression for measurement processing are provided. In use, it is determined, by the metrology system, that a predetermined condition has been met. In response to determining that the predetermined condition has been met, the metrology system automatically transitions between utilizing a library and utilizing regression for measurement processing.

DETAILED DESCRIPTION

In the field of semiconductor metrology, a metrology tool may comprise an illumination system which illuminates a target, a collection system which captures relevant information provided by the illumination system's interaction (or lack thereof) with a target, device or feature, and a processing system which analyzes the information collected using one or more algorithms. Metrology tools can be used to measure structural and material characteristics (e.g. material composition, dimensional characteristics of structures and films such as film thickness and/or critical dimensions of structures, overlay, etc.) associated with various semiconductor fabrication processes. These measurements are used to facilitate process controls and/or yield efficiencies in the manufacture of semiconductor dies.

The metrology tool can comprise one or more hardware configurations which may be used in conjunction with certain embodiments of this invention to, e.g., measure the various aforementioned semiconductor structural and material characteristics. Examples of such hardware configurations include, but are not limited to, the following.

Spectroscopic ellipsometer (SE)
SE with multiple angles of illumination
SE measuring Mueller matrix elements (e.g. using rotating compensator(s))
Single-wavelength ellipsometers
Beam profile ellipsometer (angle-resolved ellipsometer)
Beam profile reflectometer (angle-resolved reflectometer)
Broadband reflective spectrometer (spectroscopic reflectometer)
Single-wavelength reflectometer
Angle-resolved reflectometer
Imaging system
Scatterometer (e.g. speckle analyzer)

Figure 1:
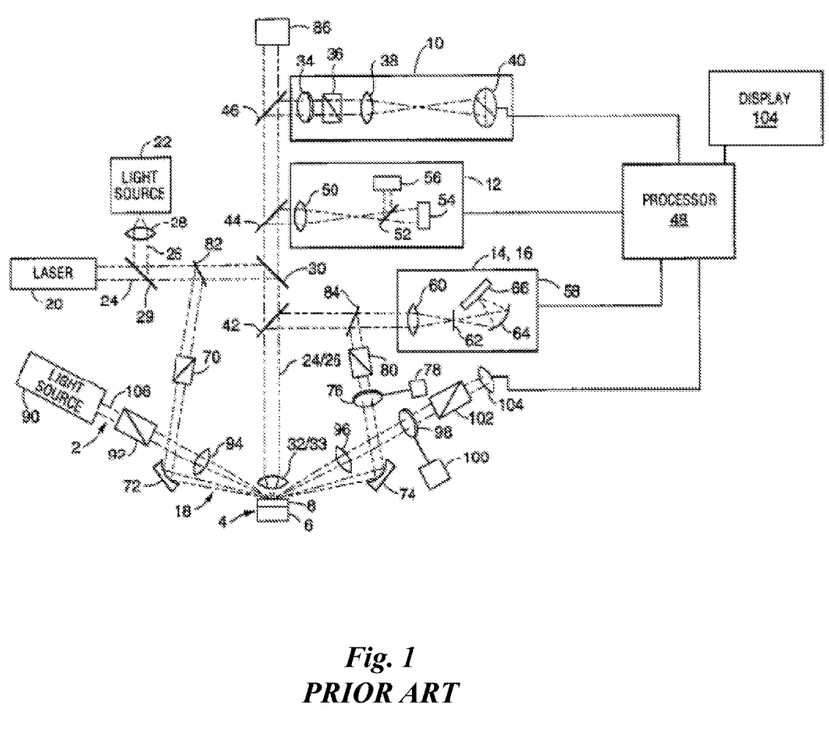
FIG. 1 shows a schematic of an exemplary metrology tool, in accordance with the prior art.

The hardware configurations can be separated into discrete operational systems. On the other hand, one or more hardware configurations can be combined into a single tool. One example of such a combination of multiple hardware configurations into a single tool is shown in FIG. 1, incorporated herein from U.S. Pat. No. 7,933,026 which is hereby incorporated by reference in its entirety for all purposes. FIG. 1 shows, for example, a schematic of an exemplary metrology tool that comprises: a) a broadband SE (i.e., 18); b) a SE (i.e., 2) with rotating compensator (i.e., 98); c) a beam profile ellipsometer (i.e., 10); d) a beam profile reflectometer (i.e., 12); e) a broadband reflective spectrometer (i.e., 14); and f) a deep ultra-violet reflective spectrometer (i.e., 16). In addition, there are typically numerous optical elements in such systems, including certain lenses, collimators, mirrors, quarter-wave plates, polarizers, detectors, cameras, apertures, and/or light sources. The wavelengths for optical systems can vary from about 120 nm to 3 microns. For non-ellipsometer systems, signals collected can be polarization-resolved or unpolarized. FIG. 1 provides an illustration of multiple metrology heads integrated on the same tool. However, in many cases, multiple metrology tools are used for measurements on a single or multiple metrology targets. This is described, for example, in U.S. Pat. No. 7,478,019, "Multiple tool and structure analysis," which is also hereby incorporated by reference in its entirety for all purposes.

The illumination system of the certain hardware configurations includes one or more light sources. The light source may generate light having only one wavelength (i.e., monochromatic light), light having a number of discrete wavelengths (i.e., polychromatic light), light having multiple wavelengths (i.e., broadband light) and/or light the sweeps through wavelengths, either continuously or hopping between wavelengths (i.e. tunable sources or swept source). Examples of suitable light sources are: a white light source, an ultraviolet (UV) laser, an arc lamp or an electrode-less lamp, a laser sustained plasma (LSP) source, for example those commercially available from Energetiq Technology, Inc., Woburn, Mass., a super-continuum source (such as a broadband laser source) such as those commercially available from NKT Photonics Inc., Morganville, N.J., or shorter-wavelength sources such as x-ray sources, extreme UV sources, or some combination thereof. The light source may also be configured to provide light having sufficient brightness, which in some cases may be a brightness greater than about 1 W/(nm cm$^2$ Sr). The metrology system may also include a fast feedback to the light source for stabilizing its power and wavelength. Output of the light source can be delivered via free-space propagation, or in some cases delivered via optical fiber or light guide of any type.

The metrology tool is designed to make many different types of measurements related to semiconductor manufacturing. Certain embodiments may be applicable to such measurements. For example, in certain embodiments the tool may measure characteristics of one or more targets, such as critical dimensions, overlay, sidewall angles, film thicknesses, process-related parameters (e.g., focus and/or dose). The targets can include certain regions of interest that are periodic in nature, such as for example gratings in a memory die. Targets can include multiple layers (or films) whose thicknesses can be measured by the metrology tool. Targets can include target designs placed (or already existing) on the semiconductor wafer for use, e.g., with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools as described in U.S. Pat. No. 7,478,019. The data from such measurements may be combined. Data from the metrology tool is used in the semiconductor manufacturing process for example to feed-forward, feed-backward and/or feed-sideways corrections to the process (e.g. lithography, etch) and therefore, might yield a complete process control solution.

As semiconductor device pattern dimensions continue to shrink, smaller metrology targets are often required. Furthermore, the measurement accuracy and matching to actual device characteristics increase the need for device-like targets as well as in-die and even on-device measurements. Various metrology implementations have been proposed to achieve that goal. For example, focused beam ellipsometry based on primarily reflective optics is one of them and described in the patent by Piwonka-Corle et al. (U.S. Pat. No. 5,608,526, "Focused beam spectroscopic ellipsometry method and system"). Apodizers can be used to mitigate the effects of optical diffraction causing the spread of the illumination spot beyond the size defined by geometric optics. The use of apodizers is described in the patent by Norton, U.S. Pat. No. 5,859,424, "Apodizing filter system useful for reducing spot size in optical measurements and other applications". The use of high-numerical-aperture tools with simultaneous multiple angle-of-incidence illumination is another way to achieve small-target capability. This technique is described, e.g. in the patent by Opsal et al, U.S. Pat. No. 6,429,943, "Critical dimension analysis with simultaneous multiple angle of incidence measurements".

Other measurement examples may include measuring the composition of one or more layers of the semiconductor stack, measuring certain defects on (or within) the wafer, and measuring the amount of photolithographic radiation exposed to the wafer. In some cases, metrology tool and algorithm may be configured for measuring non-periodic targets, see e.g. "The Finite Element Method for Full Wave Electromagnetic Simulations in CD Metrology Using Scatterometry" by P. Jiang et al (U.S. patent application Ser. No. 14/294,540, filed Jun. 3, 2014) or "Method of electromagnetic modeling of finite structures and finite illumination for metrology and inspection" by A. Kuznetsov et al. (U.S. patent application Ser. No. 14/170,150).

Measurement of parameters of interest usually involves a number of algorithms. For example, optical interaction of the incident beam with the sample is modeled using EM (electro-magnetic) solver and uses such algorithms as RCWA, FEM, method of moments, surface integral method, volume integral method, FDTD, and others. The target of interest is usually modeled (parameterized) using a geometric engine, or in some cases, process modeling engine or a combination of both. The use of process modeling is described in "Method for integrated use of model-based metrology and a process model," by A. Kuznetsov et al. (pending U.S. patent application Ser. No. 14/107,850). A geometric engine is implemented, for example, in AcuShape software product of KLA-Tencor.

Collected data can be analyzed by a number of data fitting and optimization techniques an technologies including libraries, Fast-reduced-order models; regression; machine-learning algorithms such as neural networks, support-vector machines (SVM); dimensionality-reduction algorithms such as, e.g., PCA (principal component analysis), ICA (independent component analysis), LLE (local-linear embedding); sparse representation such as Fourier or wavelet transform; Kalman filter; algorithms to promote matching from same or different tool types, and others.

Collected data can also be analyzed by algorithms that do not include modeling, optimization and/or fitting e.g. U.S. patent application Ser. No. 14/057,827.

Computational algorithms are usually optimized for metrology applications with one or more approaches being used such as design and implementation of computational hardware, parallelization, distribution of computation, load-balancing, multi-service support, dynamic load optimization, etc. Different implementations of algorithms can be done in firmware, software, FPGA, programmable optics components, etc.

The data analysis and fitting steps usually pursue one or more of the following goals:

Measurement of CD, SWA, shape, stress, composition, films, band-gap, electrical properties, focus/dose, overlay, generating process parameters (e.g., resist state, partial pressure, temperature, focusing model), and/or any combination thereof;

Modeling and/or design of metrology systems;

Modeling, design, and/or optimization of metrology targets.

The following description discloses embodiments of a metrology system, method, and computer program product (embodied on a non-transitory computer readable medium) which may be implemented in the context of the semiconductor metrology tool described above, or which may be implemented in the context of other metrology tools.

Figure 2:
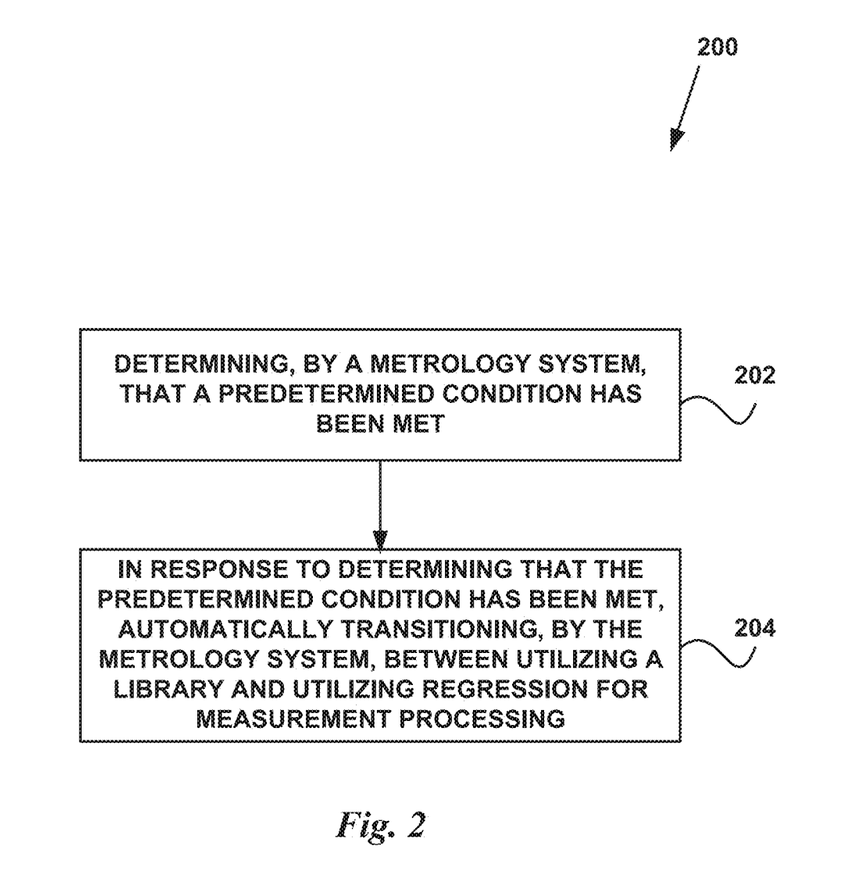
FIG. 2 illustrates a method that employs automatic transitioning between utilizing a library and utilizing regression for measurement processing, in accordance with an embodiment.

FIG. 2 illustrates a method 200 that employs automatic transitioning between utilizing a library and utilizing regression for measurement processing, in accordance with an embodiment. Optionally, the method 200 may be performed by a metrology system when the metrology system is configured (e.g. by a user) to operate in a flex mode enabling the automatic transitioning. Of course, in other embodiments the method 200 may be performed by the metrology system when operating in a default mode, or as the only mode of operation configured for metrology system. Furthermore, the method 200 may be performed with respect to measurement processing relating to a particular target component.

As shown in operation 202, it is determined, by the metrology system, that a predetermined condition has been met. In this way, the metrology system may monitor for the predetermined condition. In an embodiment where the metrology system can automatically transition from measurement processing utilizing a library to measurement processing utilizing regression, and vice versa, the predetermined condition may be specific to a type of measurement processing just performed.

For example, where the measurement processing just performed utilizes a library, then the predetermined condition may be a measurement being obtained that is outside of a range predefined within the library. As another example, where the measurement processing just performed utilizes a library, then the predetermined condition may be a measurement being obtained that has a quality that is below a predefined threshold. In these cases, the metrology system may automatically transition from utilizing the library to utilizing regression for measurement processing, as described in more detail below.

As another example, where the measurement processing just performed utilizes regression, then the predetermined condition may be that a new library has been developed. In this case, the metrology system may automatically transition from utilizing regression to utilizing the newly developed library. Of course, it should be noted that other conditions that are identifiable by the metrology system are contemplated as being criteria for the automatic transitioning between the library-based measurement processing and the regression-based measurement processing.

To this end, in response to determining that the predetermined condition has been met, the metrology system automatically transitions between utilizing a library and utilizing regression for measurement processing, as shown in operation 204. As noted above, where the measurement processing performed just prior utilizes the library, then the metrology system may automatically transition to measurement processing utilizing regression. On the other hand, where the measurement processing performed just prior utilizes regression, then the metrology system may automatically transition to measurement processing utilizing the library. In this way, the metrology system may be capable of transitioning from measurement processing utilizing the library to measurement processing utilizing regression, and vice versa, in accordance with the determination by the metrology system that the respective condition has been met.

In the context of the present description, the library may be a predefined parametric model for the target component, which when utilized during measurement processing approximates a solution to Maxwell's equations given a set of parameter values for the target component. In particular, the parametric model (i.e. library) can be used for fast and accurate approximation to calculated signals. A library may also be a predefined model that directly maps signals to critical dimension parameters to be measured. Also in the context of the present description, regression refers to solving Maxwell's equations in real-time during measurement processing to obtain the calculated signals for a corresponding set of floating parameters. This regression may also be referred to as real-time regression (RTR). In this way, measurement processing generally refers to operations utilized to analyze measurements obtained by a metrology tool, where such analysis is performed utilizing the library or regression in accordance with the type of measurement processing being performed.

As described above with respect to operation 202 and the various examples of monitored conditions, where the measurement processing performed just prior utilizes the library, then the metrology system may automatically transition to measurement processing utilizing regression when a measurement is obtained that is outside of a range predefined within the library and/or that has a quality that is below a predefined threshold. In another example, where the measurement processing performed just prior utilizes regression, then the metrology system may automatically transition to measurement processing utilizing the library when such library has been newly developed.

In one embodiment, the measurement processing utilizing the library may be executed by a general purpose computer (e.g. desktop, server, etc.). In such embodiment, the library may be stored in memory of the general purpose computer. Of course, such general purpose computer may optionally be dedicated to performing the library-based measurement processing. In further embodiments, the measurement processing utilizing regression may be executed by the same general purpose computer, a different general purpose computer, or even a dedicated regression processing (e.g. computer) cluster. In any case, the one or more subsystems executing the library-based measurement processing and the regression-based measurement processing may be components of the aforementioned metrology system.

For each measurement, the general purpose computer may make the determination of whether the predetermined condition has been met (see operation 202), and may perform the automatic transitioning (see operation 204). For example, upon determining that the predetermined condition has been met, the general purpose computer may instruct the measurement processing to be performed, regardless of whether the measurement processing is to be performed by the general purpose computer itself (e.g. in the case of using the library) or a remote subsystem (e.g. in the case of using regression). Of course, an embodiment is also contemplated where the method 200, or any operation thereof, is performed specifically by the subsystem that performed the just prior measurement processing.

To this end, the metrology system may be configured to perform the method 200 for providing flexibility in measurement processing, namely through the condition-based automatic transitioning between the faster yet accurate library-based measurement processing and the more expensive yet versatile regression-based measurement processing. This method 200 may allow a user of the metrology system to measure characteristics of a target component in a fast-changing process development with swift parameter adaptation and evolution. Moreover, when the process is stable and its variation is small, the method 200 allows for a smooth transition from a more expensive regression (i.e. in real-time) to fast yet accurate library measurement with a high volume production.

Figure 3:
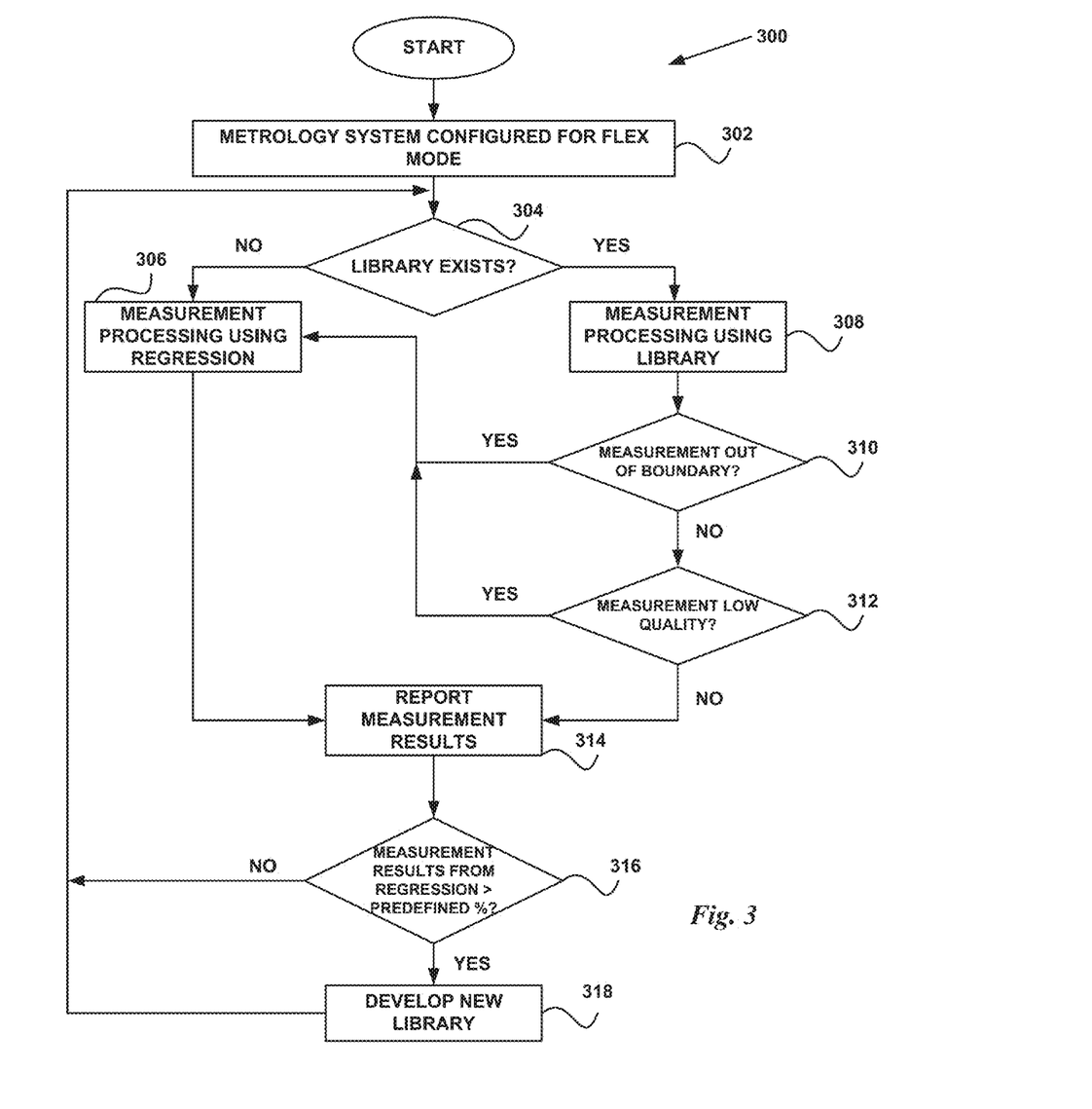
FIG. 3 illustrates a method of operation of a metrology system configured to operate in a flex mode enabling automatic transitioning between measurement processing utilizing a library and measurement processing utilizing regression, in accordance with another embodiment.

FIG. 3 illustrates a method 300 of operation of a metrology system configured to operate in a flex mode enabling automatic transitioning between measurement processing utilizing a library and measurement processing utilizing regression, in accordance with another embodiment. It should be noted that the method 300 may be carried out in the context of the method 200 of FIG. 2. Thus, the definitions and descriptions set forth above may equally apply to the method 300 of FIG. 3. Of course, however, the method 200 may be implemented in any desired context. Further, the method 300 may be performed by the metrology system at measurement time.

As shown in operation 302, a metrology system is configured to operate in a flex mode. In one embodiment, a user of the metrology system may provide input to configure the metrology system to operate in the flex mode. In another embodiment, the metrology system may be configured by default to operate in the flex mode. As noted above, the flex mode enables the metrology system to automatically transition between measurement processing utilizing a library and measurement processing utilizing regression. Further details regarding this automatic transitioning are set forth below with reference to the subsequent operations of the present method 300. It should be noted that when the metrology system is not configured to operate in the flex mode, the metrology system may solely perform measurement processing utilizing the library or may solely perform measurement processing utilizing regression (i.e. without automatic transitioning between the two).

When the metrology system is configured to operate in the flex mode, the metrology system determines whether a library exists, as shown in decision 304. For example, the metrology system may determine whether a library is stored in memory for use by the metrology system in performing measurement processing. When the metrology system determines that a library does not exist, the metrology system automatically performs measurement processing using regression (operation 306). When the metrology system determines that a library does exist, the metrology system automatically performs measurement processing using the library (operation 308).

During the measurement processing using the library, the metrology system determines in decision 310 whether the measurement being processed is outside of a boundary of the library. In particular, where the library has a predefined value range for a particular parameter, the measurement for that parameter may be outside of the boundary of the library when the measurement is outside of the value range predefined within the library.

When the metrology system determines in decision 310 that the measurement is outside of the boundary of the library, the metrology system automatically performs measurement processing using regression (operation 306). Namely, when the measurement is outside of a corresponding value range predefined within the library, the library may be incapable of being used to process the measurement, such that the metrology system may automatically perform measurement processing using regression (operation 306).

When the measurement is within the boundary of the library, the metrology system further determines in decision 312 whether a quality of the measurement is below a predefined threshold quality. For example, a goodness of fit (NGOF) may be determined for the measurement with reference to the library (e.g. within a range of 0 to 1), and compared to a predefined threshold NGOF that indicates a threshold quality.

When the metrology system determines in decision 312 that a quality of the measurement is below the predefined threshold quality, then the metrology system automatically performs measurement processing using regression (operation 306). Otherwise, when the metrology system determines in decision 312 that a quality of the measurement is not below the predefined threshold quality, then measurement processing using regression is not executed.

Accordingly, as described above, the metrology system only executes the measurement processing using regression, which requires additional resources, when a library is unavailable, or when an existing library is incapable of being used to process a measurement or a quality of the measurement is below the predefined threshold quality. In this way, the additional resources required when executing the measurement processing utilizing regression may be employed in limited circumstances, where otherwise the measurement processing utilizing the library may be employed.

Once measurement processing performed via the library or regression is complete, a result of such measurement processing is reported, as shown in operation 314. This result may be reported through a user interface of the metrology system. For example, a user may configure which parameters are to be subjected to the measurement processing, and thus which measurement processing results are to be reported via the metrology system.

The metrology system further determines in decision 316 whether an amount of measurement processing results determined through regression has exceeded a predefined threshold. As shown, this predefined threshold may be a percentage amount (i.e. measurement processing results determined through regression versus measurement processing results determined using a library). When the metrology system determines that the amount of measurement processing results determined through regression has not exceeded the predefined threshold, the metrology system returns to decision 304 for a next measurement. However, when the metrology system determines that the amount of measurement processing results determined through regression has exceeded the predefined threshold, the metrology system initiates the development of a new library for use in subsequent measurement processing (see operation 318). For example, in operation 318 the metrology system may automatically give to a user a notification that a new library should be developed for future measurement processing (e.g. to reduce the resources otherwise required to be utilized when performing measurement processing using regression). When a new library is available, the metrology system identifies this in decision 304 and accordingly proceeds with the measurement processing using the newly developed library.

Figure 4:
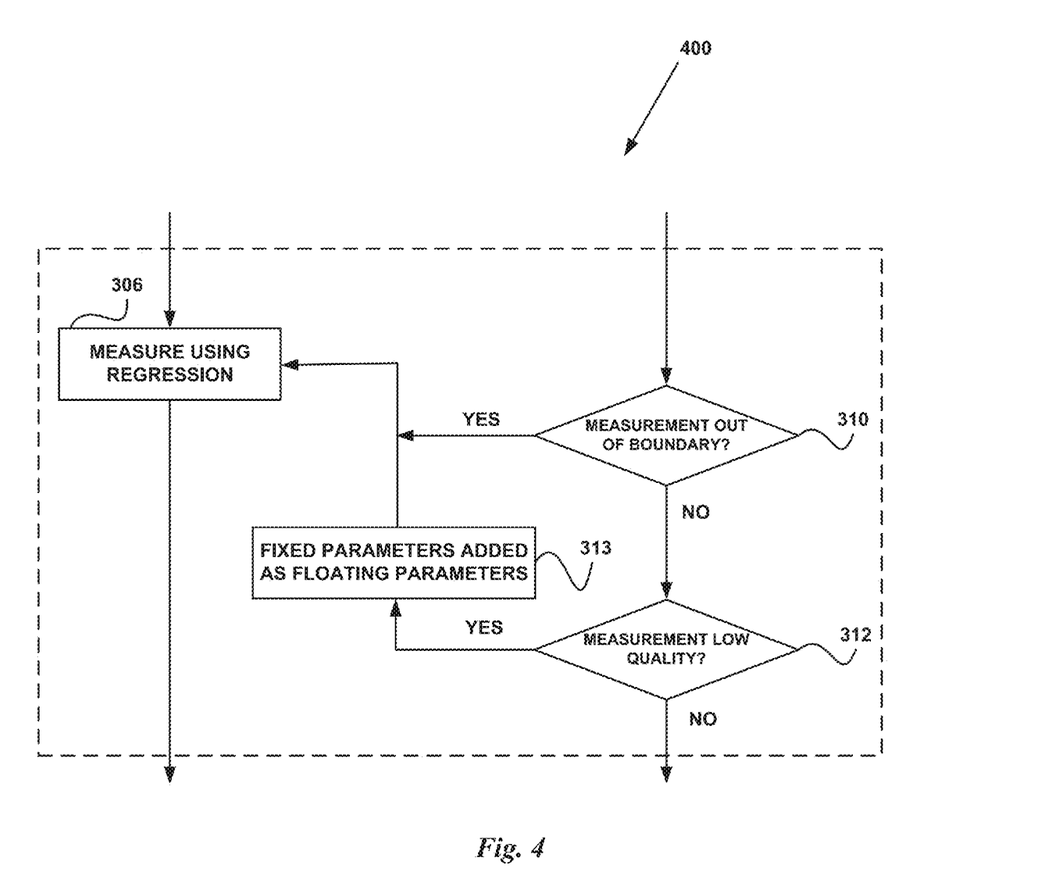
FIG. 4 illustrates a method for transitioning from measurement processing utilizing a library to measurement processing utilizing regression by identifying fixed parameters to be added as floating parameters for the measurement processing utilizing regression, in accordance with another embodiment.

FIG. 4 illustrates a method 400 for transitioning from measurement processing utilizing a library to measurement processing utilizing regression by identifying fixed parameters to be added as floating parameters for the measurement processing utilizing regression, in accordance with another embodiment. As shown, the method 400 is implemented in the context of the method 300 of FIG. 3. For example, the method 400 may be an optional extension to the method 300 of FIG. 3. Of course, however, the method 400 may be implemented in other desired contexts. Further, it should again be noted that the definitions above may equally apply to the following description.

As shown, during measurement processing utilizing a library, the metrology system may determine that a quality of a measurement being processed is below a predefined threshold quality (e.g. operation 312 of FIG. 3). When the metrology system determines that a quality of a measurement being processed is below the predefined threshold quality, the metrology system identifies fixed parameters that are to be added as floating parameters for the subsequent measurement processing to be executed utilizing regression, and those fixed parameters are added accordingly (see operation 313).

In one embodiment, a user of the metrology system may select (e.g. in advance) the fixed parameters that are to be processed as floating parameters. The user may make the selection based on a sensitivity ranking of the model parameters, or a pre-existing statistical knowledge of the process excursions.

In another embodiment, the fixed parameters may selected automatically by the metrology system. For example, the fixed parameters may be selected automatically based on a predefined correlation with one or more floating parameters (i.e. a predetermination that the fixed parameter influences to a high degree one or more floating parameters). As another example, the metrology system may pre-calculate a change rate of signals with respect to one of more fixed parameters, and compare the change rate of a fixed parameter with the misfit resulting in the low quality to select a best fitted fixed parameter or set of the fixed parameters that are to be processed as floating parameters.

Once the fixed parameters are added as floating parameters, the metrology system executes the regression-based measurement processing utilizing the floating parameters (e.g. operation 306 of FIG. 3). In this way, for each measurement processed using regression, the floating parameter set to which regression is applied may be customized (i.e. configured specifically for that measurement).

Figure 5:
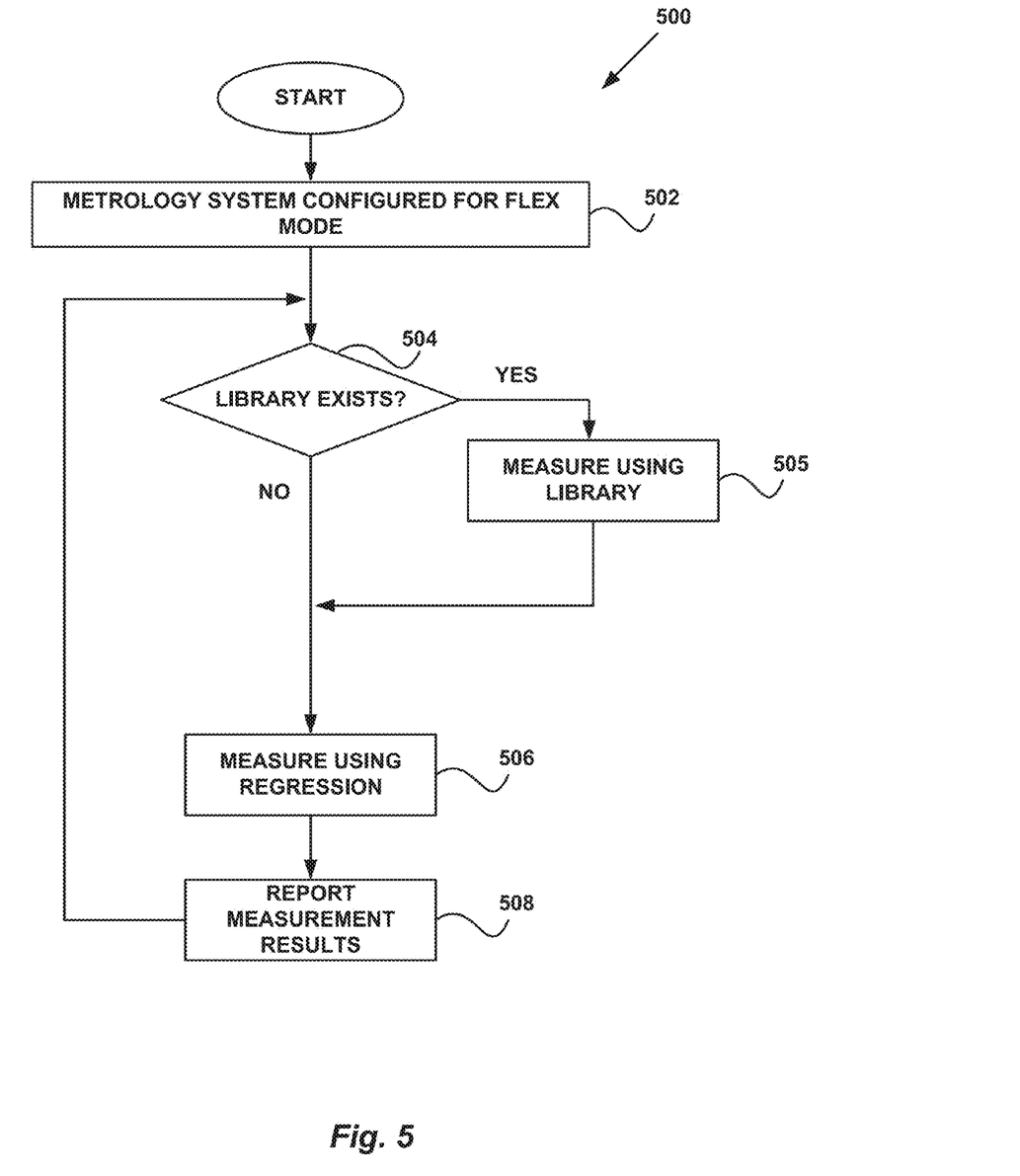
FIG. 5 illustrates a method for transitioning from measurement processing utilizing a library to measurement processing utilizing regression by providing as input to the measurement processing utilizing regression a measurement resulting from the measurement processing utilizing the library, in accordance with yet another embodiment.

FIG. 5 illustrates a method 500 for transitioning from measurement processing utilizing a library to measurement processing utilizing regression by providing as input to the measurement processing utilizing regression a measurement resulting from the measurement processing utilizing the library, in accordance with yet another embodiment. It should be noted that the method 500 may be carried out in the context of the method 200 of FIG. 2 and optionally as an alternative to the method 300 of FIG. 3. Further, the definitions and descriptions set forth above may equally apply to the method 500 of FIG. 5. Of course, however, the method 500 may be implemented in any desired context.

As shown in operation 502, a metrology system is configured to operate in a flex mode. When the metrology system is configured to operate in the flex mode, the metrology system determines whether a library exists, as shown in decision 504. For example, the metrology system may determine whether a library is stored in memory for use by the metrology system in performing measurement processing. When the metrology system determines that a library does not exist, the metrology system automatically performs measurement processing using regression (operation 506).

When the metrology system determines that a library does exist, the metrology system automatically performs measurement processing using the library (operation 505). After performing measurement processing using the library in operation 505, the metrology system automatically transitions to performing measurement processing using regression (operation 506). This transition may be made responsive to the metrology system identifying that a predetermined condition has been met (e.g. a setting configured within the metrology system). In particular, the transition may be made by providing a result of the library-based measurement processing to the regression-based measurement processing as input.

The regression-based measurement processing, shown in operation 506, may then use the result of the library-based measurement processing as a starting point. To this end, the metrology system may perform both library-based measurement processing and further regression-based measurement processing for a single measurement. Once the library-based measurement processing and the regression-based measurement processing is complete, measurement processing results are reported, as shown in operation 508. The method 500 then returns to decision 504 for a next measurement to be processed.

Figure 6:
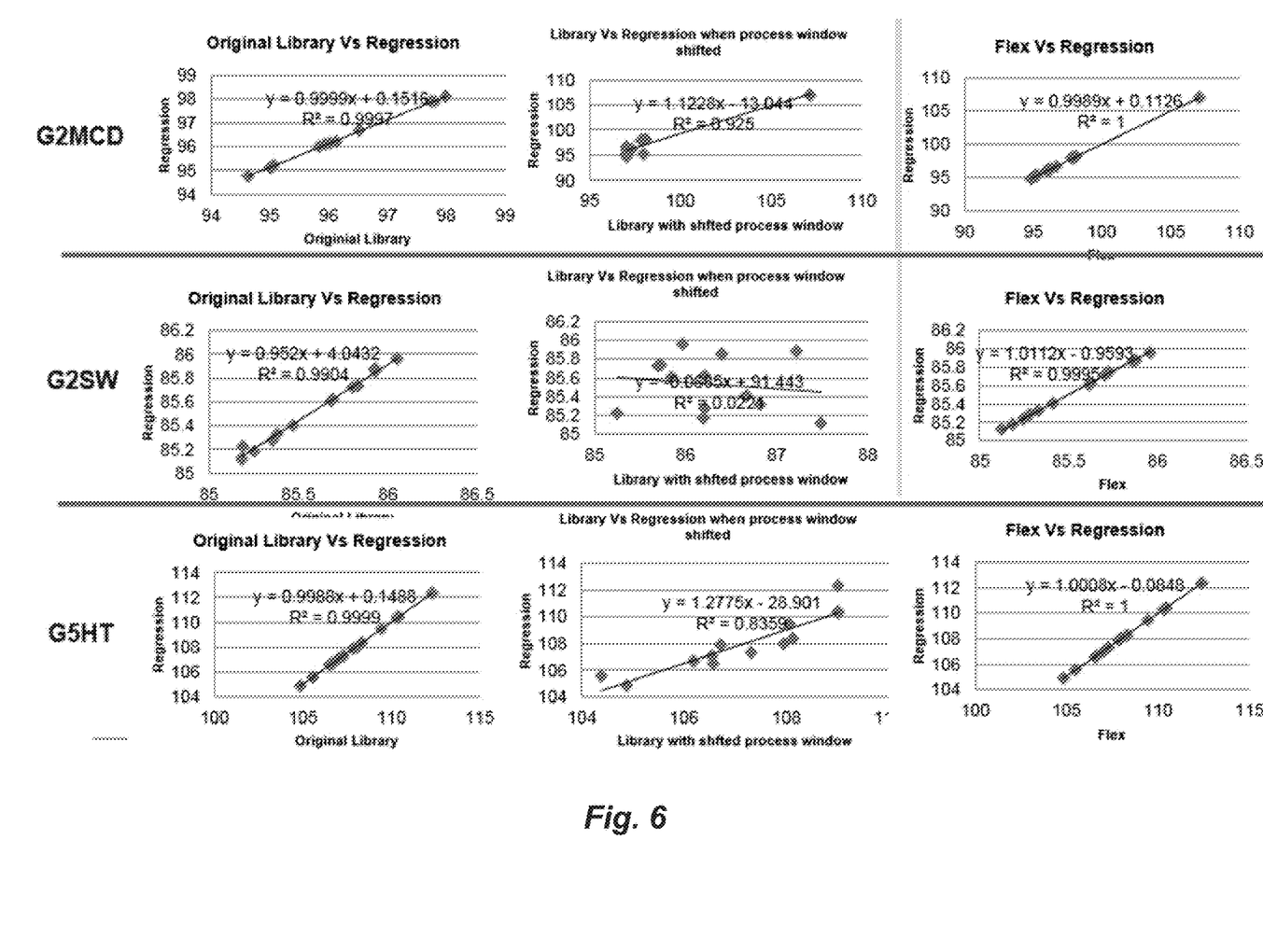
FIG. 6 illustrates graphs of quality of measurements resulting from library measurement processing and regression measurement processing, in accordance with still yet another embodiment.

FIG. 6 illustrates graphs of quality of measurements resulting from library measurement processing and regression measurement processing, in accordance with still yet another embodiment. The graphs demonstrate that the measurement credibility does not suffer during the large process parameter variation when the metrology system operates in the flex mode.

The graphs in the first column show that the library measurement can provide the accurate results when the process range is unchanged. In the event of process shift, the graphs in the middle column show the large parameter deviation between the library-based measurement processing and the regression-based measurement processing, such that the regression-based measurement processing gives a better result than the library-based measurement processing. The graphs in the right column show that the flex mode of operation can cover both cases (i.e. allowing for the desired regression-based measurement processing when the library-based measurement processing otherwise would give an undesirable result).

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
  operating a metrology system in a first mode to perform measurement processing utilizing a library, including:
    (a) collecting, by the metrology system, signals from a fabricated semiconductor device by:
      a light source of the metrology system directing light towards one or more areas of the fabricated semiconductor device, and
      a detector of the metrology system receiving light reflected from the one or more areas of the fabricated semiconductor device, generating the signals responsive to the received light, and outputting the signals to a computer subsystem, and
    (b) processing, by the computer subsystem, the signals utilizing the library to obtain measurements for the fabricated semiconductor device;
  while operating the metrology system in the first mode, determining, by the metrology system, that a first predetermined condition has been met, including that a quality of a measurement is below a predefined threshold quality; and
  in response to determining that the first predetermined condition has been met, automatically transitioning the metrology system from operating in the first mode to operating in a second mode to perform the measurement processing in association with the measurement, utilizing regression, the transitioning being performed by:
    automatically selecting, by the metrology system, fixed parameters that are to be added as floating parameters for the measurement processing utilizing the regression, and
    adding the selected fixed parameters as the floating parameters for the measurement processing utilizing the regression; and
  operating the metrology system in the second mode to perform the measurement processing in association with the measurement, utilizing the regression, including:
    performing, by the metrology system, the regression in association with the measurement utilizing the floating parameters.

2. The method of claim 1, wherein the determining and the automatic transitioning are performed by the metrology system when the metrology system is configured by a user to operate in a flex mode enabling the automatic transitioning.

3. The method of claim 1, wherein the fixed parameters are selected automatically based on a predefined correlation with the floating parameters.

4. The method of claim 1, wherein the computer subsystem is general purpose computer of the metrology system.

5. The method of claim 4, wherein the general purpose computer causes the metrology system to automatically transition from operating to perform the measurement processing utilizing the library to operating to perform the measurement processing utilizing regression.

6. The method of claim 4, wherein the measurement processing utilizing regression is executed by the general purpose computer.

7. The method of claim 4, wherein the measurement processing utilizing regression is executed by a dedicated regression processing cluster of the metrology system that is separate from the general purpose computer.

8. A non-transitory computer readable medium storing a computer program product including computer code adapted to be executed by a metrology system to cause the metrology system to perform a method, comprising:
  operating the metrology system in a first mode to perform measurement processing utilizing a library, including:
    (a) collecting, by the metrology system, signals from a fabricated semiconductor device by:
      a light source of the metrology system directing light towards one or more areas of the fabricated semiconductor device, and
      a detector of the metrology system receiving light reflected from the one or more areas of the fabricated semiconductor device, generating the signals responsive to the received light, and outputting the signals to a computer subsystem, and
    (b) processing, by the computer subsystem, the signals utilizing the library to obtain measurements for the fabricated semiconductor device;
  while operating the metrology system in the first mode, determining, by the metrology system, that a first predetermined condition has been met, including that a quality of a measurement is below a predefined threshold quality; and
  in response to determining that the first predetermined condition has been met, automatically transitioning the metrology system from operating in the first mode to operating in a second mode to perform the measurement processing in association with the measurement, utilizing regression, the transitioning being performed by:
    automatically selecting, by the metrology system, fixed parameters that are to be added as floating parameters for the measurement processing utilizing the regression, and
    adding the selected fixed parameters as the floating parameters for the measurement processing utilizing the regression; and
  operating the metrology system in the second mode to perform the measurement processing in association with the measurement, utilizing the regression, including:
    performing, by the metrology system, the regression in association with the measurement utilizing the floating parameters.

9. A metrology system, comprising:
(1) a computer subsystem for:
operating the metrology system in a first mode to perform measurement processing utilizing a library, including:
    (a) collecting, by the metrology system, signals from a fabricated semiconductor device by:
        a light source of the metrology system directing light towards one or more areas of the fabricated semiconductor device, and
        a detector of the metrology system receiving light reflected from the one or more areas of the fabricated semiconductor device, generating the signals responsive to the received light, and outputting the signals to a computer subsystem, and
    (b) processing the signals utilizing the library to obtain measurements for the fabricated semiconductor device;
while operating the metrology system in the first mode, determining that a first predetermined condition has been met, including that a quality of a measurement is below a predefined threshold quality; and
in response to determining that the first predetermined condition has been met, automatically transitioning the metrology system from operating in the first mode to operating in a second mode to perform the measurement processing in association with the measurement, utilizing regression, the transitioning being performed by:
    automatically selecting, by the metrology system, fixed parameters that are to be added as floating parameters for the measurement processing utilizing the regression, and
    adding the selected fixed parameters as the floating parameters for the measurement processing utilizing the regression; and
(2) a dedicated regression processing cluster of the metrology system or the computer subsystem for:
operating the metrology system in the second mode to perform the measurement processing in association with the measurement, utilizing the regression, including:
    performing the regression in association with the measurement utilizing the floating parameters.

10. The metrology system of claim 9, wherein the computer subsystem is a general purpose computer, and wherein automatically transitioning the metrology system from operating to perform the measurement processing utilizing the library to operating to perform the measurement processing utilizing regression including instructing, by the general purpose computer, the measurement processing utilizing regression for execution by the dedicated regression processing cluster separate from the general purpose computer.

11. The metrology system of claim 9, wherein the measurement processing utilizing regression is executed by the computer subsystem which is a general purpose computer.

* * * * *